United States Patent
Brandenburg et al.

(10) Patent No.: US 6,875,636 B2
(45) Date of Patent: Apr. 5, 2005

(54) WAFER APPLIED THERMALLY CONDUCTIVE INTERPOSER

(75) Inventors: Scott D. Brandenburg, Kokomo, IN (US); David A. Laudick, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/618,953

(22) Filed: Jul. 14, 2003

(65) Prior Publication Data

US 2005/0014312 A1 Jan. 20, 2005

(51) Int. Cl.⁷ .............................................. H01L 21/50
(52) U.S. Cl. ...................... 438/122; 438/584; 438/113; 438/455; 257/706
(58) Field of Search ................................ 438/455, 122, 438/584, 113; 257/706, E23.103

(56) References Cited

U.S. PATENT DOCUMENTS

| | | | | |
|---|---|---|---|---|
| 4,849,858 A | * | 7/1989 | Grapes et al. ............. | 361/708 |
| 5,834,337 A | * | 11/1998 | Unger et al. ................ | 438/122 |
| 6,442,039 B1 | | 8/2002 | Schreiber ................... | 361/760 |
| 2003/0006501 A1 | * | 1/2003 | Waki et al. ................. | 257/707 |

* cited by examiner

Primary Examiner—George Fourson
Assistant Examiner—Julio J Maldonado
(74) Attorney, Agent, or Firm—Stefan V. Chmielewski

(57) ABSTRACT

A thermally conductive film is attached to an integrated circuit (IC) wafer through a number of steps. Initially, a thermally conductive film is positioned on a first side of a block. Next, an IC wafer that includes a plurality of chips is positioned with its non-active side in contact with the film. Then, a first surface of an elastomer pad is positioned in contact with an active side of the wafer. Next, a predetermined pressure is applied between a second side of the block that is opposite the first side and a second surface of the elastomer pad that is opposite the first surface. Finally, the film, the block, the wafer and the elastomer pad are heated to a predetermined temperature for a predetermined time while a predetermined pressure is applied to bond the film to the wafer without bonding the film to the block.

20 Claims, 4 Drawing Sheets

WAFER APPLIED THERMALLY CONDUCTIVE INTERPOSER

TECHNICAL FIELD

The present invention is generally directed to thermal management of integrated circuits and, more specifically, thermal management through the use of a wafer applied thermally conductive interposer.

BACKGROUND OF THE INVENTION

The evolution of integrated circuits has resulted in electronic devices that have decreased in size and increased in speed, power dissipation and density. As power dissipation of electronic devices has increased, so has the need for better thermal management techniques. For example, current thermal management techniques for flip chip packaged electronic devices are generally only capable of providing a power density of 40 W/cm$^2$. However, future flip chip packaged devices may require power densities of 125 W/cm$^2$, or greater. As mentioned above, current thermal management techniques are unsatisfactory for these levels of required thermal conductivities. Thus, without better thermal management solutions, chip size may have to be increased or the performance (i.e., speed) of the chip may need to be decreased, which, in general, provides a less desirable end-product.

Traditionally, thermal management has been achieved by utilizing aluminium heat sink pedestals that are in thermal contact with a non-active side of a flip chip (or other electronic device package) and have utilized dispensed thermally conductive grease or adhesive positioned between the non-active side of the flip chip and the heat sink pedestal to increase the thermal conductivity between the flip chip and the pedestal. Unfortunately, using thermal grease to increase heat transfer between the flip chip and the heat sink pedestal can be a messy proposition. Further, thermal grease typically only provides a modest increase in heat transfer as the thermal conductivity of the grease is relatively poor, generally in the range of 0.7 W/m K, as compared to a heat sink pedestal backplate, which may have a thermal conductivity over 200 W/m K.

In assemblies implementing such a configuration, a silicon elastomer has usually been positioned within the assembly to force the flip chip in contact with the pedestal backplate. Other assemblies have utilized different thermally conductive materials between the heat sink pedestal and a non-active surface of the flip chip, such as thermal films or pads. However, these thermal materials are usually applied through hand placement or using automated pick-and-place techniques. In general, such thermal films or pads improve thermal conductivity between the flip chip and the pedestal. For example, some thermally conductive film or pads may have a thermal conductivity of up to 7.5 W/m K. However, in general, the utilization of greases and thermally conductive films and pads provide a heat transfer on the order of one to two magnitudes below the thermal conductivity of the pedestal backplate.

What is needed is a thermal management technique that provides for increased thermal conductivity between an integrated circuit (IC) chip and an associated heat sink pedestal backplate.

SUMMARY OF THE INVENTION

An embodiment of the present invention is directed to a method of attaching a thermally conductive film to an integrated circuit (IC) chip. Initially, a thermally conductive film is positioned on a first side of a block. Next, an IC wafer that includes a plurality of chips is positioned with its non-active side in contact with the film. Then, a first surface of an elastomer pad is positioned in contact with an active side of the wafer, which is on the opposite side of the non-active side of the wafer. Next, a predetermined pressure is applied between a second side of the block that is opposite the first side and a second surface of the elastomer pad that is opposite the first surface. Finally, the film, the block, the wafer and the elastomer pad are heated to a predetermined temperature for a predetermined time while a predetermined pressure is applied to bond the film to the wafer without bonding the film to the block.

According to various embodiments of the present invention, the film is a graphite filled thermoplastic epoxy material, or other material, that has a coefficient of thermal expansion (CTE) of about 29 parts per million (ppm) per ° C. with a glass transition temperature of about 200° C. In another embodiment, the heat and the pressure are applied for between about 45 to 60 minutes, with the pressure being at about 25 pounds per square inch (PSI) and the temperature at about 130° C.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to the present invention, a thermally conductive film (interposer) is bonded to an integrated circuit wafer through a number of steps. Initially, the film is placed on a non-stick block, such as Teflon block. The wafer is then placed on the film with a non-active side of the wafer in contact with the thermally conductive film. Next, an elastomer pad, which functions to assure even distribution of forces to prevent silicon and solder bump breakage and deformation of flip chip and ball grid array (BGA) type devices, is placed on the active side of the wafer. The assembly is then heated to approximately 130° C. and a press is used to provide about 25 pounds per square inch (PSI) of pressure to bond the film to the wafer.

After removal of the wafer from the press, the wafer, including its attached film, is placed on an adhesive tape, e.g., Nitto™ tape, and is then diced using standard semiconductor processes. The resulting devices, e.g., flip chips, ball grid arrays (BGAs), chip scale packages (CSPs) etc. can then be placed on a substrate, for example, a printed circuit board (PCB), and reflowed with thermally conductive material already bonded to the backside of the chips. This process improves the standard process of applying thermal conductive materials, such as dispensing of thermal greases, automated pick-and-place of thermal films or hand placement of thermal pads. The film nay take various forms, such as, for example, a graphite filled thermoplastic epoxy material manufactured and made commercially available by B-Tech Corporation (Part No. ATTA LP-1). Such a graphite filled thermoplastic epoxy material, in general, shows a magnitude improvement in thermal conductivity, when compared to thermally conductive materials that are currently used in semiconductor thermal management applications.

Graphite filled thermoplastic epoxy materials generally have other favorable material properties, such as a coefficient of thermal expansion (CTE) of about 29 parts per million (ppm) per ° C. and a glass transition temperature of about 200° C. It should be appreciated that the above-described process can be used with any number of chip type devices, such as flip chips, ball grid arrays (BGAs) or chip scale packages (CSPs). After the substrate, e.g., a PCB, is populated with various electronic components and a flip chip, the flip chip can then be placed in contact with a heat sink pedestal backplate with the thermally conductive film of the flip chip device in contact with the heat sink pedestal backplate. The bonding of the film to the backplate may then be achieved during a structural adhesive cure step that attaches the substrate to, for example, a portion of a case that encloses the substrate. It should be appreciated that the substrate may be overmolded, if desired, for environmental reasons.

Figure 1:
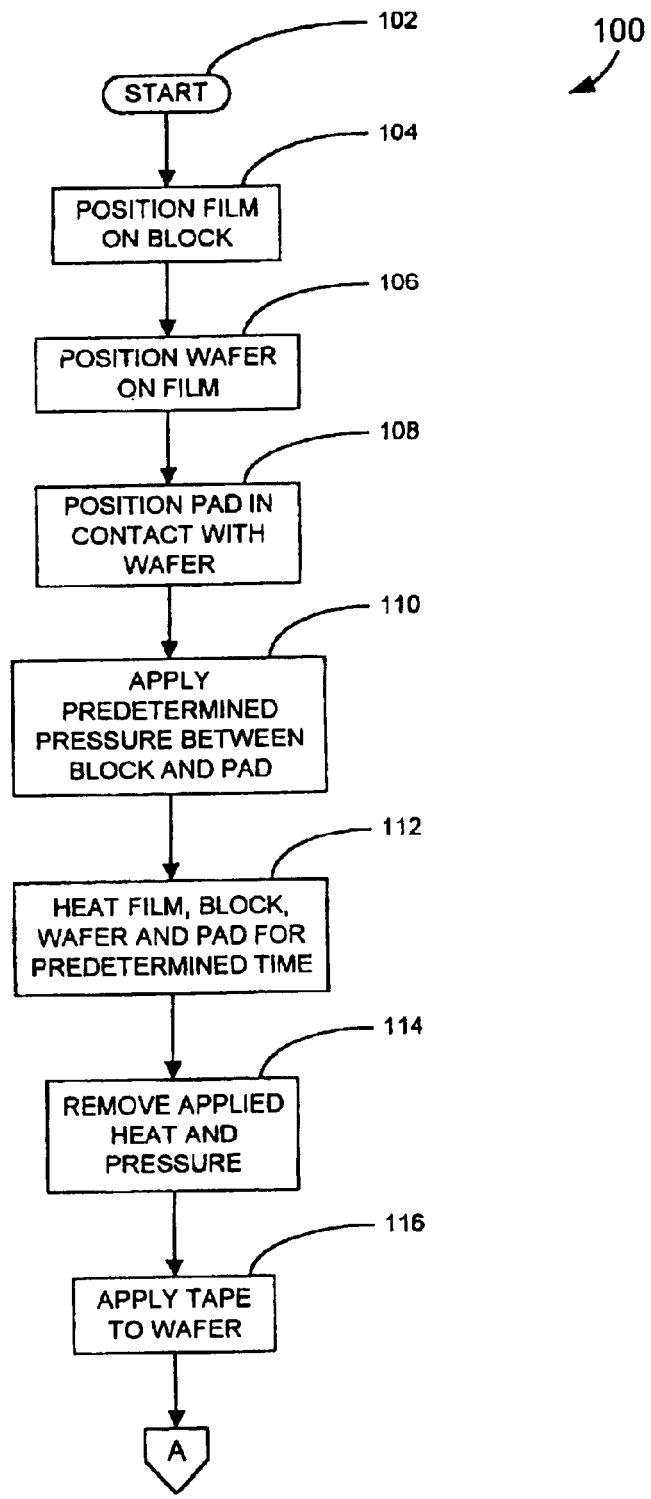
FIGS. 1 and 1A depict a flow chart of a process for applying a thermally conductive film to an integrated circuit (IC) chip, according to one embodiment of the present invention.
Figure 1A:
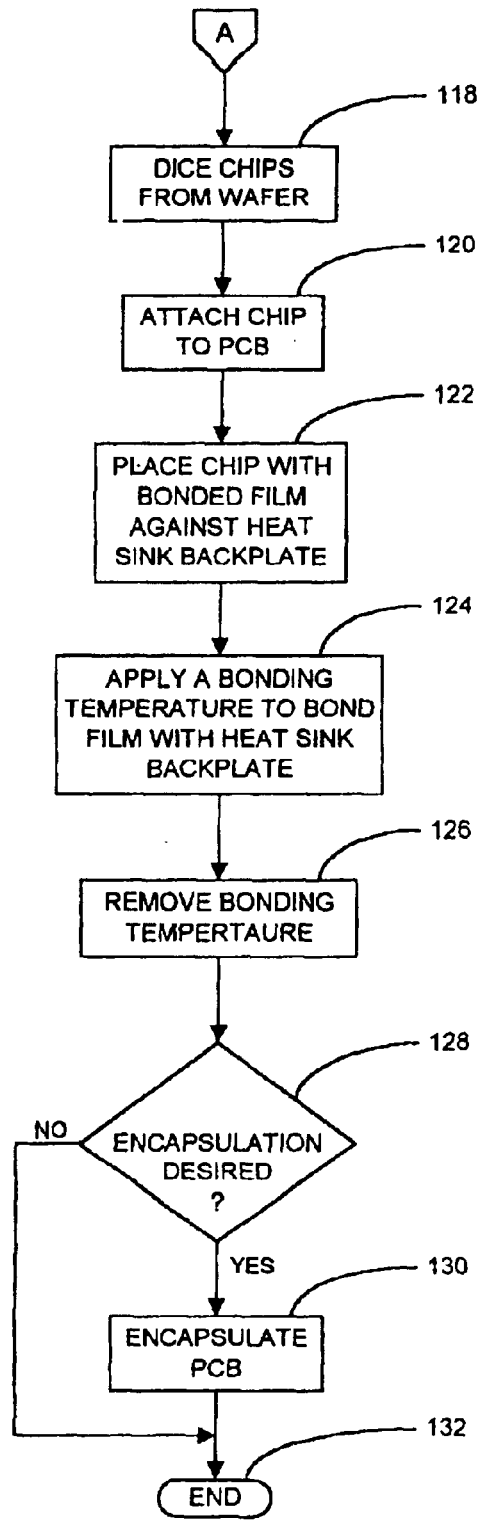

With reference to FIGS. 1 and 1A, a process 100, according to present invention, for placing a thermally conductive film on a non-active side of a chip is further disclosed. The process 100 is initiated in step 102, at which point a thermally conductive film (interposer) is positioned on a non-stick block, such as a Teflon® block. Next, in step 106, an integrated circuit (IC) wafer is positioned on the film. Then, in step 108, an elastomer pad is positioned in contact with the wafer. As mentioned above, the elastomer pad protects the contacts formed on the active side of the chip. Next, in step 110, a predetermined pressure is applied between the block and the pad. Then, the film, the block, the wafer and the pad are heated for a predetermined time, e.g., forty-five to sixty minutes.

In step 114, the applied pressure and heat are removed and, in step 116, an adhesive tape, such as a Nitto™ tape, is applied to the wafer. Next, in step 118, chips are diced from the wafer and in step 120 the chips are attached to a substrate, e.g., a PCB. In step 122, the associated PCB is positioned such that the chip with the bonded film is against a heat sink backplate. Then, in step 124, a bonding temperature is applied to bond the film with the heat sink backplate. It should be appreciated that this can be achieved during the step in which a structural adhesive is heated to fasten the PCB in place to, for example, the case in which the PCB is enclosed. Next, in step 126, the bonding temperature is removed, at which point control transfers to decision step 128. In decision step 128, if encapsulation is desired, the process transfers to step 130, where the PCB is encapsulated, at which point control transfers to step 132. In step 128, when encapsulation is not desired, control transfers to step 132 where the process terminates.

Figure 2:
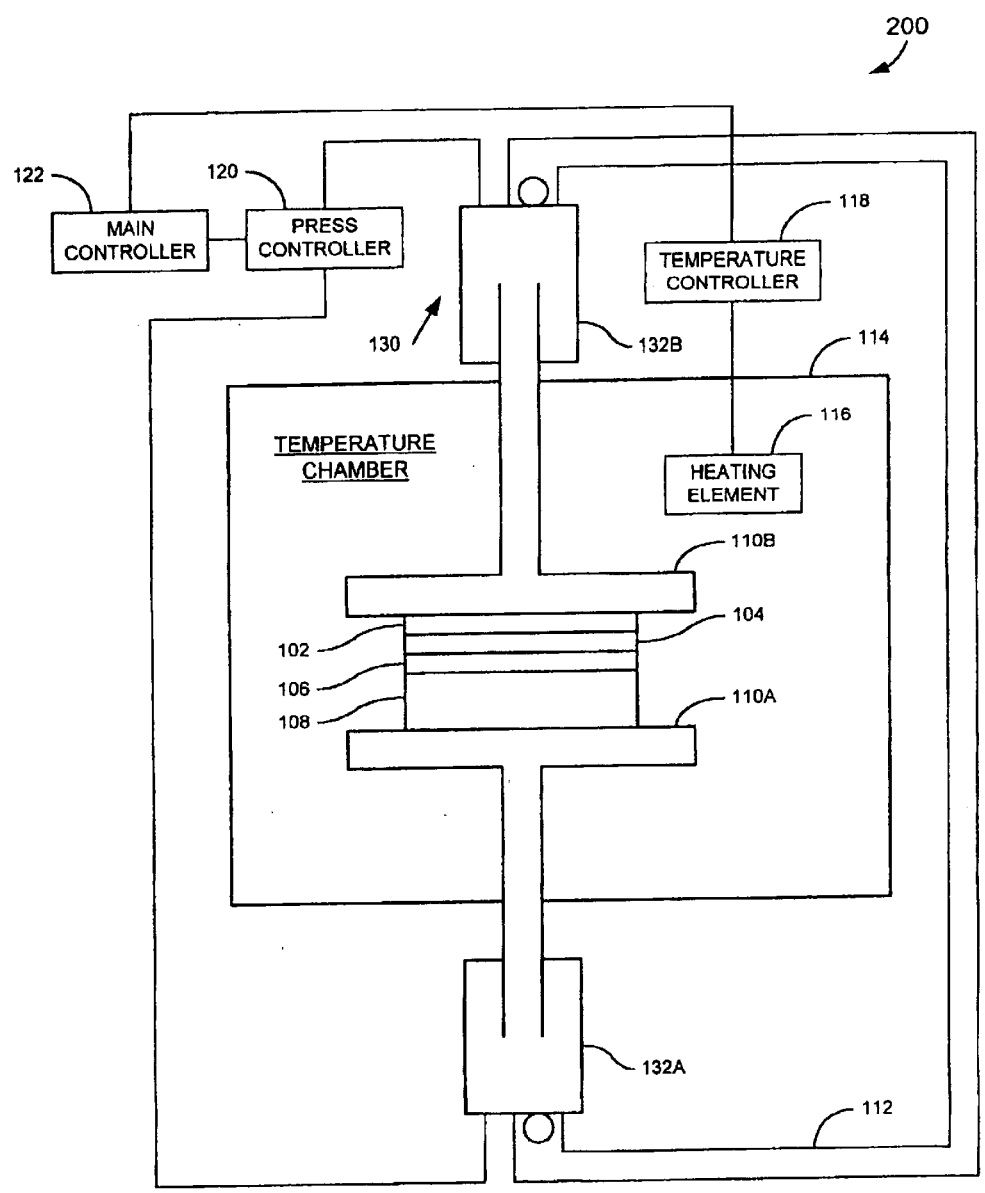
FIG. 2 is a schematic diagram of an assembly (including a press and temperature chamber) for applying a thermally conductive film to a wafer that includes a plurality chips.

FIG. 2 depicts an exemplary system 200, which includes a temperature chamber 114 and a press 130. The press 130 includes a support structure 112 with rams 132A and 132B extending from the support structure 112. An assembly, including an elastomer pad 102, a wafer 104, a film 106 and a block 108, is positioned between plates 110A and 110B. The plate 110A, which contacts the block 108, is positioned at the end of the ram 132A and the plate 110B, which contacts elastomer pad 102, is positioned at the end of the ram 132B. A temperature controller 118 is electrically coupled to a heating element 116 and a main controller 122. The main controller 122 is electrically coupled to a press controller 120, which is electrically coupled to the rams 132A and 132B. The temperature controller 118 and the press controller 120 are controlled by the main controller 122 to set the heating element 116 and the rams 132A and 132B to an appropriate temperature and pressure, respectively.

According to the present invention, heat and pressure are applied to the pad 102, the wafer 104, the film 106 and the block 108 for a predetermined time period to effect a bond between the film 106 and the wafer 104, without effecting a bond between the film 106 and the block 108. For example, a pressure of about 25 pounds per square inch (PSI) and a temperature of about 130° C. may be applied to the assembly for between about 45 to 60 minutes to effect the bond between the film 106 and the wafer 104.

Figure 3:
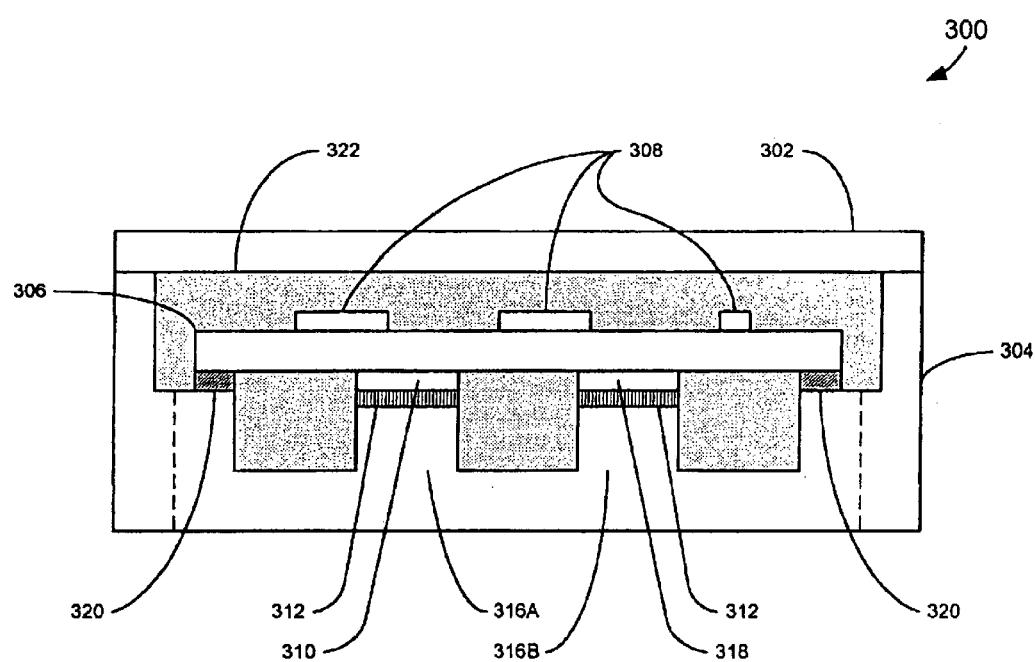
FIG. 3 is a cross-sectional view of an electronic module including a printed circuit board (PCB) with integrated circuits that include a bonded thermally conductive film that is bonded according to the process of FIGS. 1 and 1A.

FIG. 3 depicts an exemplary electronic module 300 manufactured according to an embodiment of the present invention. The module 300 includes a case 304 and an associated cover 302. The case 304 receives a substrate, e.g., a printed circuit board (PCB), 306, which may include a plurality of surface mount devices (SMDs) 308 located on one side of the board and a plurality of integrated circuit (IC) chips mounted on an opposite side of the PCB 306, which may include a flip chip 310 and a ball grid array (BGA) 318, which include a thermally conductive film 312 that has been bonded to the flip chip 310 and the BGA 318 through the process described herein. The substrate 306 is positioned within the case 304 such that the films 312 that are bonded to the flip chip 310 and the BGA 318 are in contact with the heat sink pedestals 316A and 316B, respectively. An adhesive 320 is placed at a plurality of points to attach the substrate 306 to the case 304. During a curing step associated with the adhesive 320, the adhesive 306 and the film 312 are heated such that the film 312 thermally bonds with the heat sink pedestals 316A and 316B. If desired, the case 304 may be filled with an epoxy 322 to environmentally seal the substrate 306 and its associated electronic components.

Accordingly, a process has been described herein which provides for increased thermal conductivity for integrated circuit (IC) chips. This process is particularly advantageous in the manufacturing of automotive electronic modules, where higher power densities are increasingly required.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A method of attaching a thermally conductive film to an integrated circuit (IC) chip, comprising the steps of:

positioning a thermally conductive film on a first side of a block;

positioning an IC wafer on the film, wherein a non-active side of the wafer is in contact with the film, and wherein the IC wafer includes a plurality of chips;

positioning a first surface of an elastomer pad in contact with an active side of the wafer, wherein the active side of the wafer is opposite the non-active side of the wafer;

applying a predetermined pressure between a second side of the block that is opposite the first side and second surface of the elastomer pad that is opposite the first surface; and heating the film, the block, the wafer and the elastomer pad to a predetermined temperature for a predetermined time while the predetermined pressure is applied to bond the film to the wafer, wherein the film does not bond to the block.

2. The method of claim 1, wherein the film is a graphite filled thermoplastic epoxy material.

3. The method of claim 1, wherein the coefficient of thermal expansion (CTE) of the film is about 29 ppm/° C.

4. The method of claim 1 wherein the coefficient of thermal expansion (CTE) of the film is about 29 ppm/° C.

5. The method of claim 1, wherein the glass transition temperature of the film is about 200 degrees Celsius.

6. The method of claim 1, wherein the glass transition temperature of the film is abut 200 degrees Celsius.

7. The method of claim 1, wherein the heat and the pressure are applied for between about forty-five to sixty minutes, and wherein the pressure is about 25 pounds per square inch (PSI) and the temperature is about 130 degrees Celsius.

8. The method of claim 1, wherein the block is made of TEFLON.

9. The method of claim 1, further including the steps of:
removing the applied heat and pressure from the wafer;
applying an adhesive tape to the wafer;
dicing individual ones of the chips from the wafer;
electrically attaching at least one of the diced chips to a substrate;
placing the chip and its associated film against a heat sink backplate; and
applying a bonding temperature to the chip to bond the film with the heat sink backplate.

10. The method of claim 9, wherein the chips are in one of a flip chip package and a chip scale package (CSP).

11. A method of attaching a thermally conductive film to an integrated circuit (IC) chip, comprising the steps of:
positioning a thermally conductive film on a first side of a TEFLON block, wherein the film is a graphite filled thermoplastic epoxy material;
positioning an IC wafer on the film, wherein a non-active side of the wafer is in contact with the film, and wherein the IC wafer includes a plurality of chips;
positioning a first surface of an elastomer pad in contact with an active side of the wafer, wherein the active side of the wafer is opposite the non-active side of the wafer;
applying a predetermined pressure between a second side of the block that is opposite the first side and second surface of the elastomer pad that is opposite the first surface; and
beating the film, the block, the wafer and the elastomer pad to a predetermined temperature for a predetermined time while the predetermined pressure is applied to bond the film to the water, wherein the film does not bond to the block.

12. The method of claim 11, wherein the coefficient of thermal expansion (CTE) of the film is about 29 ppm/° C.

13. The method of claim 11, wherein the glass transition temperature of the film is about 200 degrees Celsius.

14. The method of claim 11, wherein the heat and the pressure are applied for between about forty-five to sixty minutes, and wherein the pressure is about 25 pounds pet square inch (PSI) and the temperature is about 130 degrees Celsius.

15. The method of claim 11, further including the steps of:
removing the applied heat and pressure from the water;
applying an adhesive tape to the water;
dicing individual ones of the chips from the wafer;
electrically attaching at least one of the diced chips to a substrate;
placing the chip and its associated film against a heat sink backplate; and
applying a bonding temperature to the chip to bond the film with the heat sink backplate.

16. The method of claim 15, wherein the chips are in one of a flip chip package and a chip scale package (CSP).

17. A method of attaching a thermally conductive film to an integrated circuit (IC) chip, comprising the steps of:
positioning a thermally conductive film on a first side of a TEFLON block, wherein the film is a graphite filled thermoplastic epoxy material;
positioning an IC wafer on the film, wherein a non-active side of the wafer is in contact with the film, and wherein the IC wafer includes a plurality of chips;
positioning a first surface of an elastomer pad in contact with an active side of the wafer, wherein the active side of the wafer is opposite the non-active side of the wafer;
applying a predetermined pressure between a second side of the block that is opposite the first side and second surface of the elastomer pad that is opposite the first surface; and
heating the film, the block, the wafer and the elastomer pad to a predetermined temperature for a predetermined time while the predetermined pressure is applied to bond the film to the wafer, wherein, the coefficient of thermal expansion (CTE) of the film is about 29 ppm/° C., and wherein the glass transition temperature of the film is about 200 degrees Celsius and the film does not bond to the block.

18. The method of claim 17, wherein the heat and the pressure are applied for between about forty-five to sixty minutes, and
wherein the pressure is about 25 pounds per square inch (PSI) and the temperature is about 130 degrees Celsius.

19. The method of claim 17, further including the steps of:
removing the applied heat and pressure from the wafer;
applying an adhesive tape to the wafer;
dicing individual ones of the chips from the wafer;
electrically attaching at least one of the diced chips to a substrate;
placing the chip and its associated film against a heat sink backplate; and
applying a bonding temperature to the chip to bond the film with the heat sink backplate.

20. The method of claim 19, wherein the chips are in one of a flip chip package and a chip scale package (CSP).

* * * * *